(12) United States Patent
Hayashi et al.

(10) Patent No.: US 8,720,873 B2
(45) Date of Patent: May 13, 2014

(54) SUBSTRATE HOLDING DEVICE

(75) Inventors: Shinichi Hayashi, Koshi (JP); Suguru Enokida, Koshi (JP); Naruaki Iida, Koshi (JP); Hideki Kajiwara, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 140 days.

(21) Appl. No.: 13/418,731

(22) Filed: Mar. 13, 2012

(65) Prior Publication Data

US 2012/0235335 A1 Sep. 20, 2012

(30) Foreign Application Priority Data

Mar. 18, 2011 (JP) ................................. 2011-060716

(51) Int. Cl.
*B25B 1/00* (2006.01)
*B24B 5/00* (2006.01)
*B24B 29/00* (2006.01)
*A47J 45/00* (2006.01)
*H01L 21/683* (2006.01)

(52) U.S. Cl.
USPC ............................. 269/21; 451/285; 294/64.3

(58) Field of Classification Search
USPC ........... 269/21; 451/285–288; 294/64.1, 64.3, 294/65, 902; 414/935–941
See application file for complete search history.

(56) References Cited

U.S. PATENT DOCUMENTS

| | | | |
|---|---|---|---|
| 6,942,265 B1 * | 9/2005 | Boyd et al. ..................... 294/189 |
| 7,081,045 B2 * | 7/2006 | Boo et al. ...................... 451/288 |
| 7,669,903 B2 * | 3/2010 | Bonora et al. ................. 294/188 |
| 7,836,845 B2 * | 11/2010 | Tanoue et al. .................. 118/500 |
| D674,761 S * | 1/2013 | Iida et al. ...................... D13/182 |
| 8,419,299 B2 * | 4/2013 | Matsuoka et al. ............. 396/611 |
| 8,528,889 B2 * | 9/2013 | Nakano et al. ............ 269/289 R |
| 2010/0243168 A1* | 9/2010 | Nakano et al. ........... 156/345.54 |
| 2012/0224945 A1* | 9/2012 | Douki et al. .................. 414/758 |

FOREIGN PATENT DOCUMENTS

| | | |
|---|---|---|
| JP | A-08-229866 | 9/1996 |
| JP | 2001-341090 A | 12/2001 |
| JP | 2011-029388 A | 2/2011 |

* cited by examiner

*Primary Examiner* — Lee D Wilson
*Assistant Examiner* — Alvin Grant
(74) *Attorney, Agent, or Firm* — Posz Law Group, PLC

(57) ABSTRACT

A substrate holding device including: a transfer arm body having a suction path; a pad body including a suction part having a suction surface and a suction port for holding the substrate by vacuum suction, and a cylindrical attachment part in which a suction hole communicating with the suction port is formed; a pad holding member provided with an insertion hole into which the attachment part of the pad body is loosely insertable and a communication path communicating with the suction hole and the suction path, and fixed to the transfer arm body; and an elastically deformable annular airtightness maintaining member with a circular cross-section interposed between an outer peripheral groove in an arc shape formed in the attachment part of the pad body and an inner peripheral groove in an arc shape formed at the insertion hole of the pad holding member.

8 Claims, 9 Drawing Sheets

SUBSTRATE HOLDING DEVICE

BACKGROUND OF THE INVENTION

1. Field of the Invention

The present invention relates to a substrate holding device holding a substrate by vacuum suction.

2. Description of the Related Art

Generally, in a manufacturing line of a semiconductor wafer or the like, a photolithography technology is used for forming a pattern of resist on a front surface of a substrate such as the semiconductor wafer or an LCD substrate. This photolithography technology can form a predetermined resist pattern on the front surface of the substrate by performing a series of treatments such as a resist coating treatment of applying a resist solution on the front surface of the substrate, exposure treatment of exposing a pattern on the formed resist film, a developing treatment of supplying a developing solution to the substrate after the exposure treatment and so on. As an apparatus performing the series of treatments, a coating and developing apparatus is known. The coating and developing apparatus is a complex apparatus composed of a plurality of process treatment apparatuses performing the treatments, in which a wafer is delivered between the treatment apparatuses by a substrate transfer device and subjected to the series of treatments in a predetermined order. This substrate transfer device includes a transfer arm for holding and transferring the substrate, and a structure in which a suction member for holding the substrate by vacuum suction is attached to the transfer arm is known.

Conventionally, as the substrate for vacuum-sucking the substrate while coping with the warpage, distortion, inclination or the like of the substrate, the following one is known. Specifically, a suction member is attached to freely protrude and retract from/to a base, and the suction member is composed of a lower member and an upper member. The upper member is biased upward by a coil spring, and a suction surface is formed on the surface of the upper surface. Further, a spherical ball part formed on the lower side of the center of the upper member is fitted and connected to a sliding surface in the form of a spherical inner surface formed at the upper portion of the center of the lower member, so that slide of a spherical joint obtained by the connection makes the suction surface freely incline in a swinging manner with respect to the lower member. To maintain the negative pressure in an exhaust path formed in the structure, airtightness of each of center holes of a support shaft portion of the lower member and a pedestal member and annular grooves of a sleeve member and the pedestal member press-inserted into the lower member is maintained by a labyrinth structure fitted thereto. Further, in order to increase the airtightness of the exhaust path, an O-ring is attached in a manner to come into contact with the bottom surface of the lower member so that when the suction member is lowered, the pedestal member and the O-ring are brought into contact with each other (see Patent Document 1).

Patent Document 1: Japanese Laid-open Patent Publication No. H8-229866

SUMMARY OF THE INVENTION

However, in the structure described in Patent Document 1, in addition of the structure that the upper member is biased upward by the coil spring to make the suction surface freely protrude and retract, it is necessary to form the spherical ball part on the lower side of the center of the upper member in order to attach the suction surface to freely incline in a swinging manner, and to form the sliding surface in the form of a spherical inner surface in the lower member. Furthermore, in order to maintain the airtightness of the exhaust flow path, a labyrinth structure is additionally formed in the structure, and the O-ring is attached. Therefore, there is a problem that the structure is complicated and the number of parts increases, resulting in increased manufacturing cost.

The present invention is made in consideration of the above circumstances, and a substrate holding device of the present invention includes: a transfer arm body having a suction path; a pad body including a suction part having a suction surface and a suction port for holding the substrate by vacuum suction, and a cylindrical attachment part in which a suction hole communicating with the suction port is formed; a pad holding member provided with an insertion hole into which the attachment part of the pad body is loosely insertable and a communication path communicating with the suction hole and the suction path, and fixed to the transfer arm body; and an elastically deformable annular airtightness maintaining member with a circular cross-section interposed between an outer peripheral groove in an arc shape formed in the attachment part of the pad body and an inner peripheral groove in an arc shape formed at the insertion hole of the pad holding member.

By configuring as described above, the annular airtightness maintaining member interposed between the outer peripheral groove formed in the pad body and the inner peripheral groove formed in the pad holding member elastically deforms, whereby the suction surface formed in the suction part of the pad body is formed to be able to protrude and retract with respect to the pad holding member and formed to be able to incline in any direction within 360 degrees with respect to the pad holding member.

According to the present invention, even with a simple structure with a smaller number of parts, a substrate can be stably held by vacuum suction even if the substrate has warpage or distortion.

DETAILED DESCRIPTION OF THE INVENTION

Hereinafter, substrate holding devices according to first and second embodiments of the present invention will be described in detail based on the accompanying drawings. The case in which the substrate holding devices are applied in a resist coating and developing treatment apparatus for a semiconductor wafer will be described here.

Figure 1:
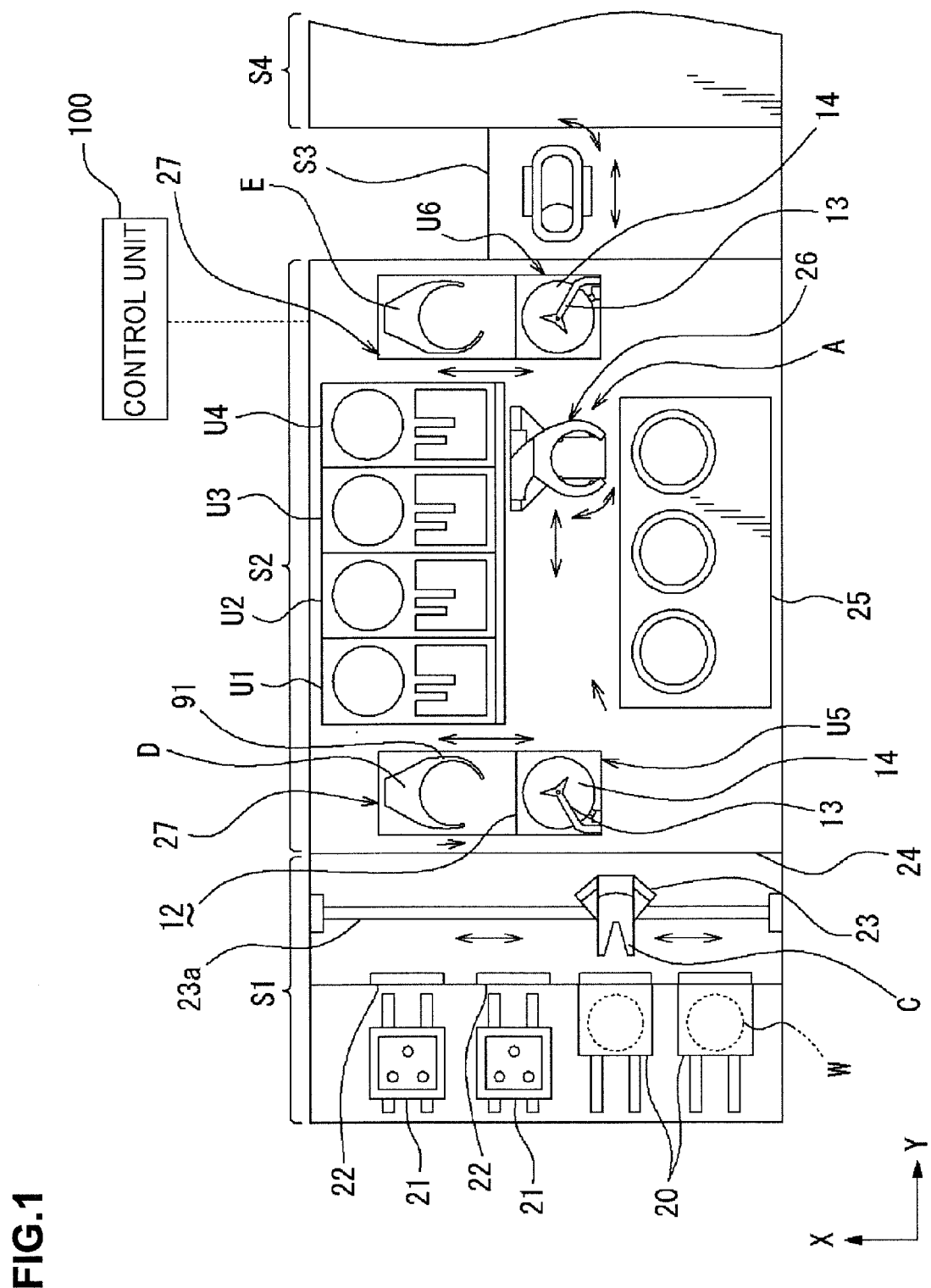
FIG. 1 is a schematic plan view illustrating an example of a resist coating and developing treatment apparatus including substrate holding devices according to the present invention.

As illustrated in FIG. 1, the resist coating and developing treatment apparatus includes a carrier block S1 for transferring in/out a carrier 20 hermetically housing, for example, 13 semiconductor wafers W (hereinafter, referred to as wafers W) being substrates, a treatment block S2 configured in which a plurality of, for example, five unit blocks are vertically stacked, an interface block S3, and an exposure apparatus S4 that is a second treatment block.

In the carrier block S1, mounting tables 21 on which a plurality of (for example, four) carriers 20 can be mounted thereon, opening/closing parts 22 provided in the front wall surface as viewed from the mounting tables 21 side, and a substrate transfer device 23 for taking the wafer W out of the carrier 20 via the opening/closing part 22 and delivering the wafer W between the carrier 20 and a not-illustrated delivery stage provided in a shelf unit U5 are provided. The substrate transfer device 23 is composed of a transfer arm C holding the wafer W, a not-illustrated driving device, a rail 23a, and so on.

To the back side of the carrier block S1, the treatment block S2 whose periphery is surrounded by a casing 24 is connected. The treatment block S2 is configured such that a unit block (DEV layer) for performing developing treatment, an anti-reflection film forming unit block (not illustrated) for performing treatment of forming an anti-reflection film (hereinafter, referred to as a "first anti-reflection film") formed on the lower layer side of a resist film, a coating film forming unit block (not illustrated) for performing coating treatment of the resist solution, and an anti-reflection film forming unit block (not illustrated) for performing treatment of forming an anti-reflection film (hereinafter, referred to as a "second anti-reflection film") formed on the upper layer side of the resist film, are stacked in the vertical direction from the lower side.

FIG. 1 is a schematic plan view illustrating the DEV layer among the unit blocks stacked in the vertical direction. Describing the DEV layer, a developing unit 25 including a plurality of developing treatment sections for performing developing treatment is provided on the right side when viewed from the carrier block S1 side to the back side. Further, for example four shelf units U1, U2, U3, U4 in each of which units of a heating system are multi-tiered are provided in order on the left side when viewed from the carrier block S1 side to the back side. In this drawing, various units for performing pre-treatment and post-treatment of the treatment performed in the developing unit 25 are stacked at a plurality of tiers, for example, three tiers each. Each of the treatment units stacked in the shelf units U1 to U4 is housed in a treatment container, and a not-illustrated wafer W transfer-in/out port is formed at each treatment container.

Near the center of the treatment block S2, a transfer area for the wafer W is formed. In the transfer area, a substrate transfer device 26 for delivering the wafer between all of the modules (a place where the wafer W is placed) in the DEV layer, for example, the treatment units in the shelf units U1 to U4, the developing unit 25, and the units in the shelf units U5, U6 is provided. The substrate transfer device 26 is composed of a substrate holding device (a main arm A) holding the wafer W according to the first embodiment of the present invention, a not-illustrated driving device for configuring the main arm A to be movable in horizontal X- and Y-directions and in a vertical Z-direction and rotatable and movable around the vertical axis, a rail and so on. The driving device is drive-controlled based on a transfer program by a control unit 100.

Note that the substrate transfer device 26 is provided also in the other blocks stacked in the vertical direction as in the above-described developing treatment unit block (DEV layer).

On the carrier block S1 side in the treatment block S2, the shelf unit U5 is provided at a position to which the transfer arm C and the main arm A can access as illustrated in FIG. 1, and a substrate transfer device 27 for delivering the wafer W between the units stacked in the shelf unit 5 is provided. The substrate transfer device 27 is composed of a substrate holding device (a delivery arm D) holding the wafer W according to the second embodiment of the present invention, a not-illustrated driving device for configuring the delivery arm D to be movable in horizontal X- and Y-directions and in a vertical Z-direction and rotatable and movable around the vertical axis, a rail and so on. The driving device is drive-controlled based on a transfer program by the control unit 100.

In this case, the shelf unit U5 includes the not-illustrate delivery stage in order to deliver the wafer W to/from the main arm A. Further, the shelf unit U5 includes a plurality of partitioned housing blocks (not illustrated), a plurality of mounting shelves 13, and a cooling plate 14 for adjusting the wafer W to a predetermined temperature before resist coating, for adjusting the wafer W to a predetermined temperature before anti-reflection film forming treatment, and for adjusting the wafer W which has been subjected to heat treatment after exposure treatment to a predetermined temperature.

On the other hand, on the interface blocks S3 side in the treatment block S2, the shelf unit U6 is provided at a position to which the main arm A can access, and a substrate transfer device 27 for delivering the wafer W between the units constituting the shelf unit U6 is provided. The substrate transfer device 27 is composed of a substrate holding device (a delivery arm E) holding the wafer W according to a third embodiment of the present invention, a not-illustrated driving device for configuring the delivery arm E to be movable in horizontal X- and Y-directions and in a vertical Z-direction and rotatable and movable around the vertical axis, a rail and so on. The driving device is drive-controlled based on a transfer program by the control unit 100.

The shelf unit U6 includes, as with the shelf unit U5, a not-illustrate delivery stage in order to deliver the wafer W to/from the main arm A, a plurality of partitioned housing blocks (not illustrated), a plurality of mounting shelves 13, and a cooling plate 14 for adjusting the wafer W which has been subjected to heat treatment after exposure treatment to a predetermined temperature.

Figure 2A:
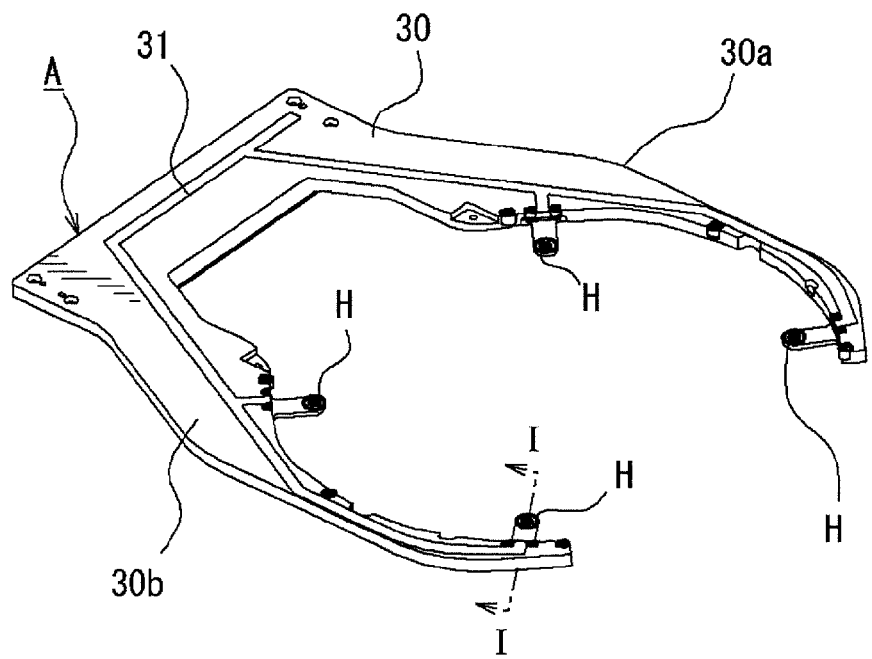
FIG. 2A is a perspective view illustrating a substrate holding device according to a first embodiment.
Figure 3:
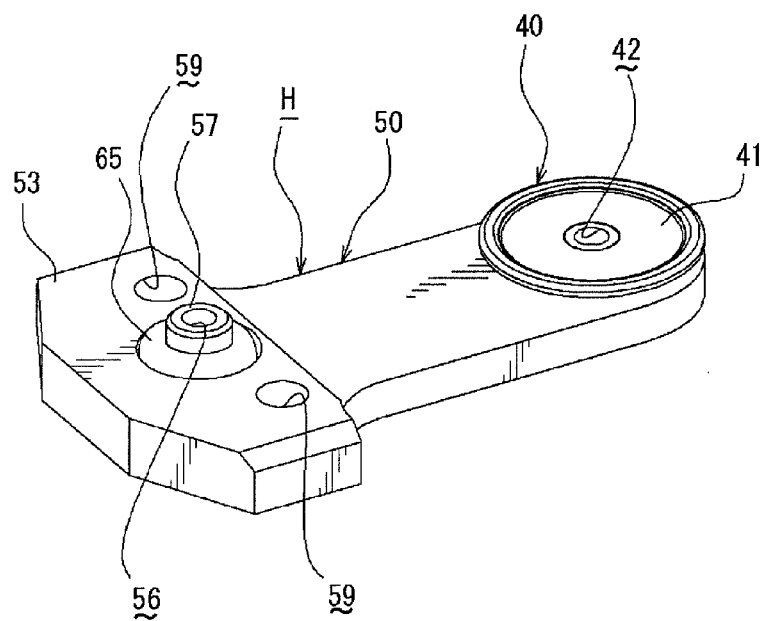
FIG. 3 is a perspective view illustrating a pad body and a pad holding member in the first embodiment.

Next, the substrate holding devices according to the embodiments will be described referring to FIG. 2A and subsequent drawings. FIG. 2A is a perspective view of the main arm A being the substrate holding device according to the first embodiment of the present invention. The main arm A has a transfer arm body 30 having a suction path 31. The transfer arm body 30 is formed of a pair of curved arm pieces 30a, 30b into an almost horseshoe shape. At four places at the lower portions on the tip end portion side and the base end portion side of the curved arm pieces 30a, 30b, pad units H each composed of a pad body 40 and a pad holding member 50 illustrated in FIG. 3 are attached.

Figure 4:
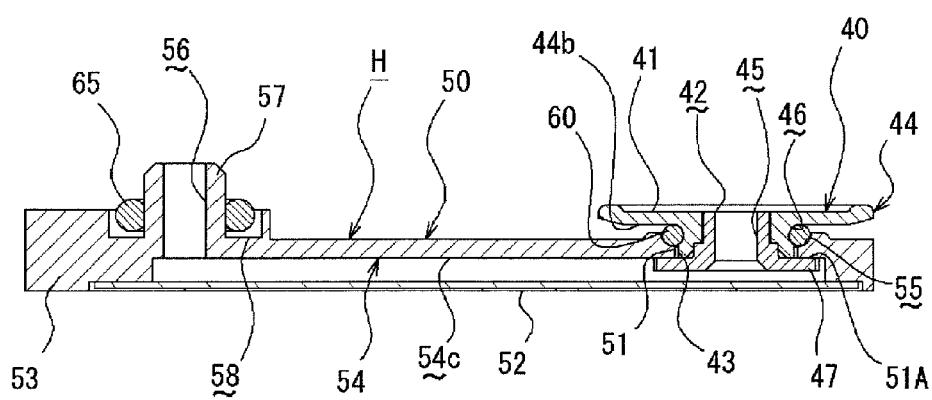
FIG. 4 is a sectional view illustrating the pad body and the pad holding member.

The pad body 40 has a suction part 44 having a suction surface 41 and a suction port 42 for holding the wafer W by vacuum suction, and a cylindrical attachment part 43 in which a suction hole 45 communicating with the suction port 42 is formed, illustrated in FIG. 4. In the pad holding member 50, an insertion hole 51 into which the attachment par 43 of the pad body 40 can be loosely inserted, and a communication path 54 communicating with the suction hole 45 and the suction path 31 are formed. The pad holding member 50 is fixed to the transfer arm body 30. Between an outer peripheral groove 46 in an arc shape formed in the attachment part 43 of the pad body 40 and an inner peripheral groove 55 in an arc shape formed at the insertion hole 51 of the pad holding member 50, an annular airtightness maintaining member with a circular cross-section which is elastically deformable, for example, an O-ring 60 is provided. The main arm A is mainly composed of the pad body 40, the pad holding member 50, and the annular airtightness maintaining member.

Figure 7:
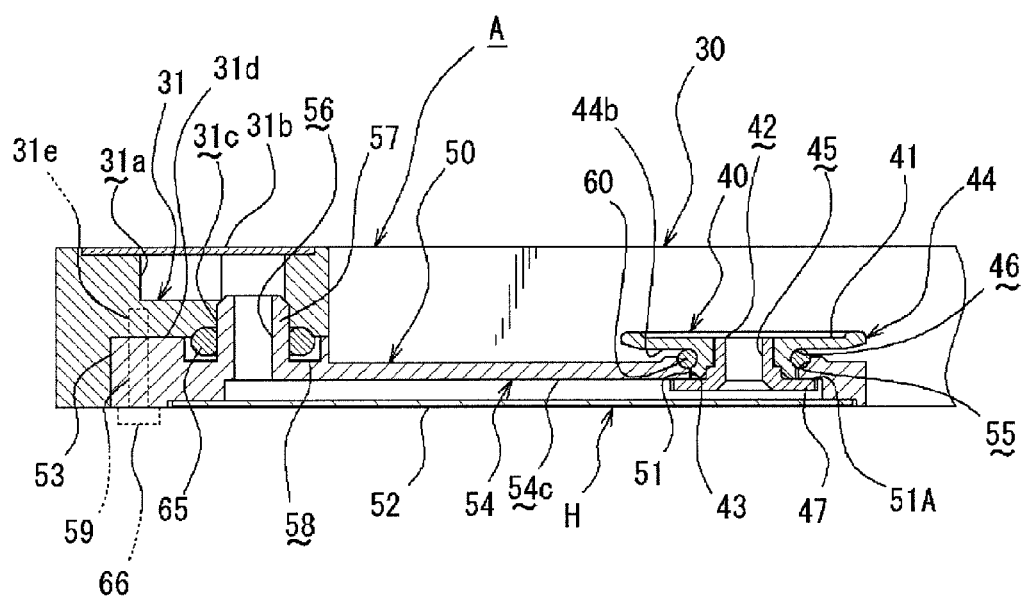
FIG. 7 is a sectional view taken along a line I-I of FIG. 2A.

Further, the suction path 31 is formed in the transfer arm body 30 as illustrated in FIG. 2A, The suction path 31 is formed on the side of the front surface holding the wafer W thereon of the transfer arm body 30 as illustrated in FIG. 7, and is composed of a groove part 31a communicating from the base end side to a connection hole 31c coupled with each pad unit H, and a lid part 31b covering the groove part 31a from the front surface side to hermetically seal the groove part 31a. In this case, the connection hole 31c is formed from the bottom surface of the groove part 31a toward the rear surface side, and communicates with a cutout part 31d to which a later-described connection part 53 of the pad holding member 50 is coupled. In the bottom surface of the cutout part 31d, screw holes 31e for fixing the pad unit H with bolts 66 are formed at two places. The suction path 31 configured as described above is connected to a not-illustrated vacuum exhaust part from the base end side of the transfer arm body 30 and can vacuum-suck the wafer W via the pad unit H.

Figure 2B:
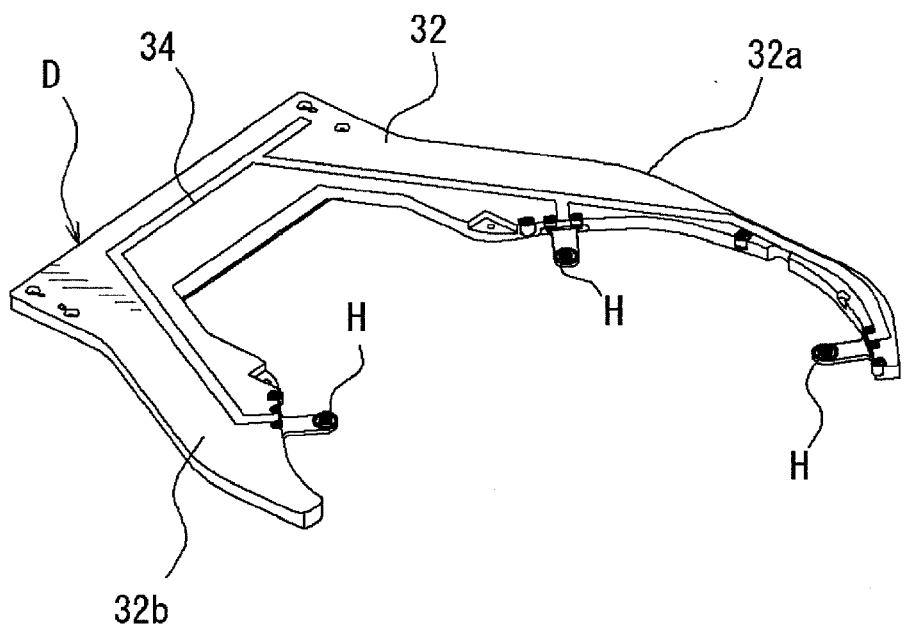
FIG. 2B is a perspective view illustrating a substrate holding device according to a second embodiment.

FIG. 2B is a perspective view of the delivery arm D being the substrate holding device according to the second embodiment of the present invention. A transfer arm body 32 of the delivery arm D is formed of a curved arm piece 32a and a shortened arm piece 32b for avoiding interference with the mounting shelf 13 into a modified horseshoe shape. At three places at the lower portions on the tip end portion side and the base end portion side of the curved arm piece 32a and at the base end portion side of the shortened arm piece 32b, pad units H are attached. In this case, a suction path 34 having the same structure as that of the transfer arm body 30 is formed in the transfer arm body 32. Note that the delivery arm E according to the third embodiment is structured such that the curved arm piece 32a and the shortened arm piece 32b formed in the transfer arm body 32 of the delivery arm D are inversely arranged as illustrated in FIG. 1.

The pad body 40 includes, as illustrated in FIG. 3 to FIG. 8B, the suction part 44 having the suction surface 41 and the suction port 42 for holding the wafer W by vacuum suction, the cylindrical attachment part 43 in which the suction hole 45 communicating with the suction port 42 is formed, and the outer peripheral groove 46 in an arc shape formed in the attachment part 43 as described above. Further, the suction part 44 is formed in a flange shape outward from the upper end of the attachment part 43, and the outer peripheral groove 46 is formed starting from the attachment part 43 to a lower surface 44b of the suction part 44. Further, a locking flange part 47 extending outward is formed at the lower portion of the attachment part 43 of the pad body 40.

Figure 8A:
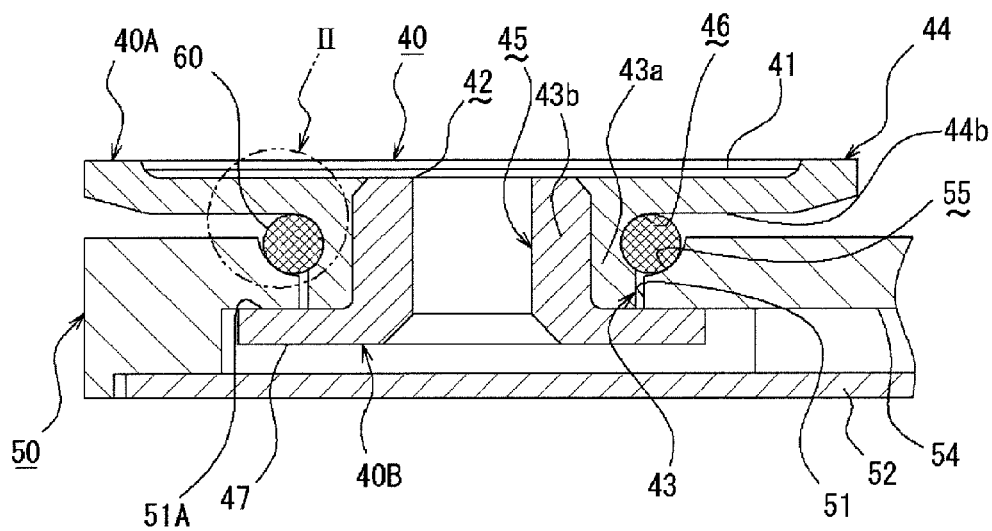
FIG. 8A is an enlarged sectional view of a principal part of the substrate holding device according to the first embodiment.

The pad body 40 is formed by fitting an upper pad member 40A with a lower pad member 40B as illustrated in FIG. 8A. Note that the upper pad member 40A and the lower pad member 40B can be formed using a synthetic resin, for example, resin such as polybenzimidazole (PBI) and is preferably made of a reinforced synthetic resin containing carbon fiber in PBI.

The upper pad member 40A includes a cylindrical attachment part outer cylinder 43a, the suction part 44 formed in a flange shape outward from the upper end of the attachment part outer cylinder 43a and having the suction surface 41 on its surface, and the outer peripheral groove 46 in an arc shape formed starting from the attachment part outer cylinder 43a to the lower surface 44b of the suction part 44.

On the other hand, the lower pad member 40B includes a cylindrical attachment part inner cylinder 43b, the suction port 42 opened at the upper end of the attachment part inner cylinder 43b, the suction hole 45 formed in a penetrating manner starting from the suction port 42 to the lower end of the attachment part inner cylinder 43b, and the locking flange part 47 extending outward from the lower end of the attachment part inner cylinder 43b.

The pad body 40 can be assembled by fitting the attachment part outer cylinder 43a formed in the upper pad member 40A with the attachment part inner cylinder 43b formed in the lower pad member 40B via an adhesive.

In this case, the attachment part outer cylinder 43a of the upper pad member 40A and the attachment part inner cylinder 43b of the lower pad member 40B form, in the pad body 40, the cylindrical attachment part 43 in which the suction hole 45 communicating with the suction port 42 is formed.

The pad holding member 50 includes, as illustrated in FIG. 3 to FIG. 7, the insertion hole 51 into which the attachment par 43 of the pad body 40 can be loosely inserted, the communication path 54 communicating with the suction hole 45 and the suction path 31, and the inner peripheral groove 55 in an arc shape formed in the insertion hole 51. Note that the inner peripheral groove 55 is formed at an edge portion of the opening of the insertion hole 51, and a locking stepped part 51A to which the locking flange part 47 of the pad body 40 can be locked is formed on the outside of the lower end of the insertion hole 51. Further, the connection part 53 for detachably fixing the pad holding member 50 to the transfer arm body 30 is formed at one end portion of the pad holding member 50 via a sealing member, for example, an O-ring 65.

Figure 5:
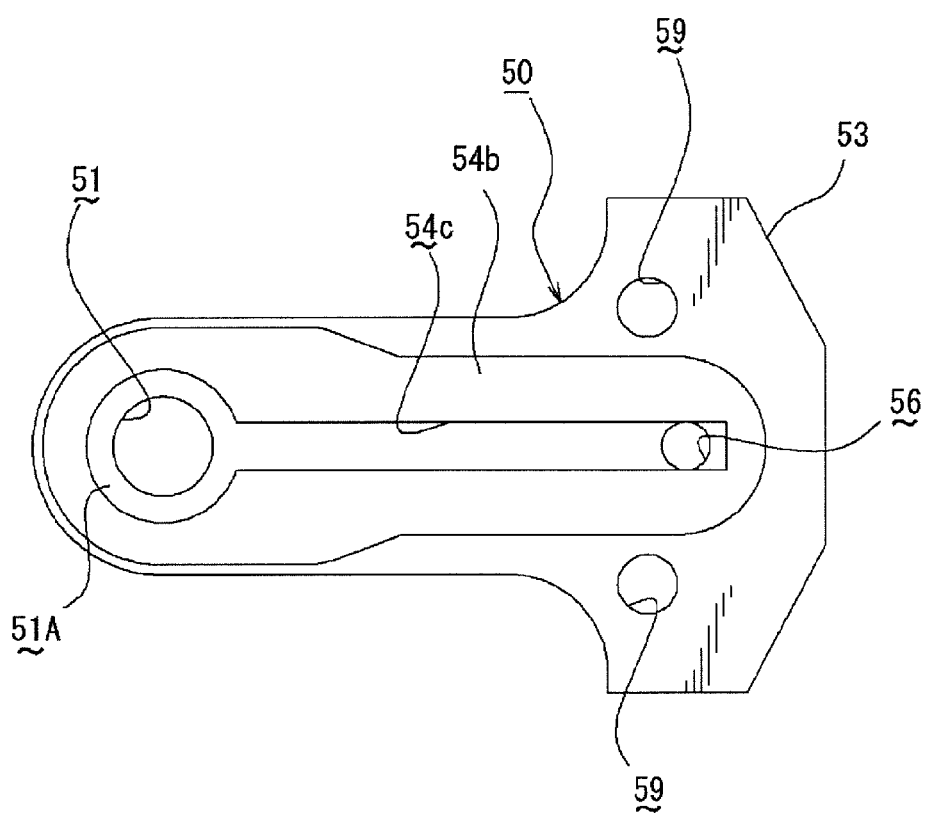
FIG. 5 is a rear surface view illustrating an insertion hole and a communication path of the pad holding member.

The communication path 54 is composed of a groove part 54c formed starting from the inside of one end portion to the inside of the other end portion on a surface (rear surface) side of the pad holding member 50 opposite to the front surface holding the wafer W thereon, and a lid part 52 for covering and hermetically sealing the groove part 54c. As illustrated in FIG. 5, the insertion hole 51 into which the attachment par 43 of the pad body 40 can be loosely inserted, in communication with the one end portion of the groove part 54c constituting the communication path 54, is formed toward the front surface side of the pad holding member 50. On the other hand, a communication hole 56 for communicating with the suction path 31, in communication with the other end portion of the groove part 54c constituting the communication path 54, is formed toward the front surface side of the pad holding member 50. Around the groove part 54c, a lid receiving groove 54b to which the lid part 52 hermetically sealing the groove part 54c from the rear surface side is provided.

At the connection part 53, the above-described communication hole 56 is formed penetrating a cylindrical projecting part 57, and a peripheral groove 58 is formed to surround the outer periphery on the base end side of the projecting part 57 as illustrated in FIG. 3, FIG. 4, FIG. 5. Into the peripheral groove 58, a sealing member for maintaining airtightness at a coupling portion with the transfer arm body 30, for example, the elastically deformable sealing O-ring 65 made of rubber is inserted. Further, through holes 59 communicating with screw holes 31e formed at the cutout part 31d of the transfer arm body 30 are formed at two places in the connection part 53.

Figure 8B:
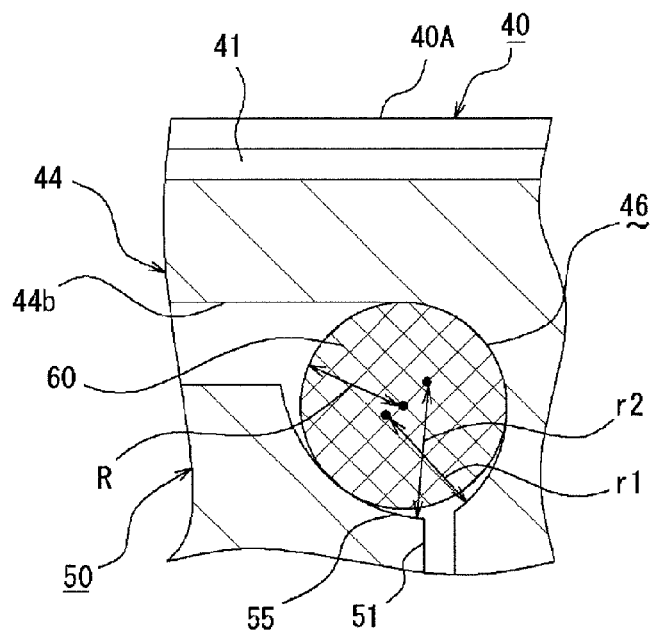
FIG. 8B is an enlarged sectional view of a part II of FIG. 8A.

For the annular airtightness maintaining member, for example, an elastically deformable O-ring 60 made of rubber having a circular cross-section is used as illustrated in FIG. 4, FIG. 7, FIGS. 8A and 8B. In this case, as illustrated in FIG. 8B, a radius of curvature r2 of the inner peripheral groove 55 formed in the pad holding member 50 and a radius of curvature r1 of the outer peripheral groove 46 formed in the pad body 40 are slightly larger than a radius R of the circular cross-section of the O-ring 60. Further, the upper portion of the O-ring 60 projects from the front surface of the pad holding member 50 when the O-ring 60 is supported in the inner peripheral groove 55.

Figure 6A:
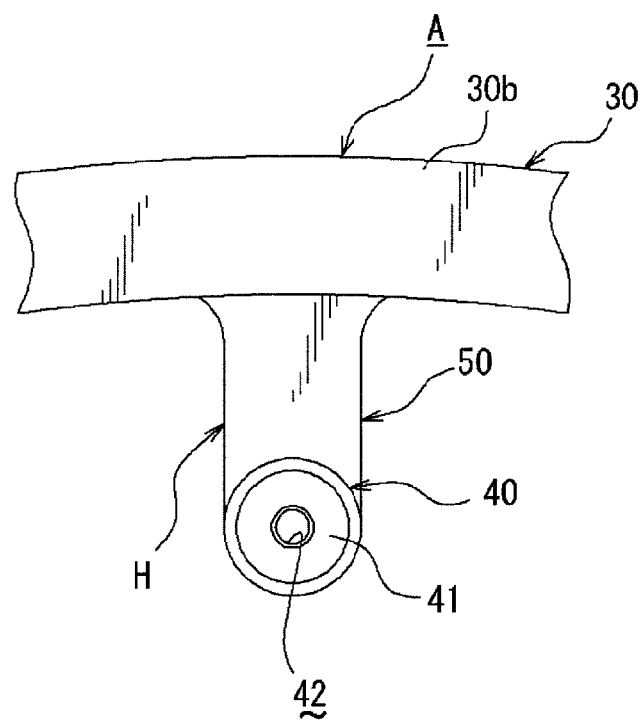
FIG. 6A is a schematic plan view illustrating an attachment state of the substrate holding device according to the first embodiment.
Figure 6B:
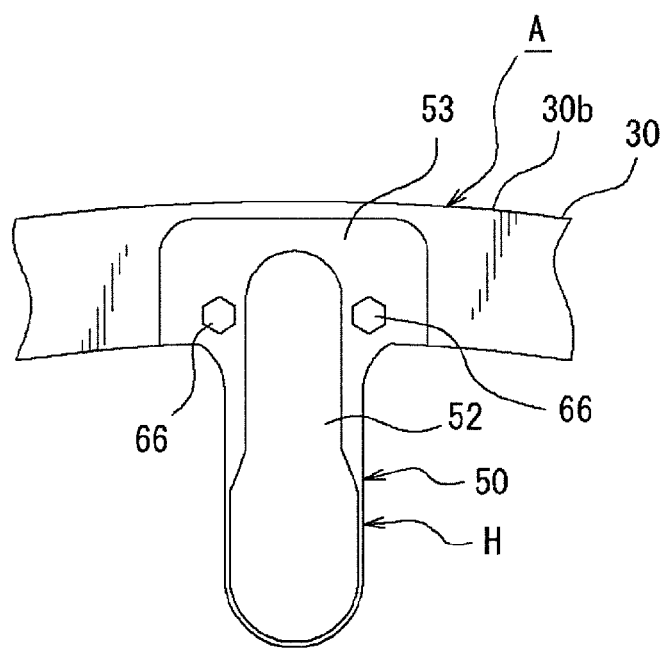
FIG. 6B is a perspective rear view.

For assembling the pad unit H with the transfer arm body 30 configured as described above, the end portion side of the pad unit H where the pad body 40 is disposed is directed to the inner peripheral side of the transfer arm body 30, the projecting part 57 of the pad holding member 50 is inserted into the connection hole 31c of the transfer arm body 30 from the rear surface side, and the connection part 53 is fitted to the cutout hole 31d as illustrated in FIGS. 6A and 6B, FIG. 7. In this event, between the transfer arm body 30 and the pad holding member 50, the sealing O-ring 65 is elastically deformed and interposed. Then, the bolts 66 are inserted into the through holes 59 formed in the connection part 53 from the rear surface side and screwed to the screw holes 31e in the transfer arm body 30. In this manner, the pad holding member 50 is detachably fixed to the transfer arm body 30 via the sealing O-ring 65.

The pad units H are attached in a manner to start from the lower side of the lower portions on the tip end portion side and the base end portion side of the curved arm pieces 30a, 30b with the end portion side where the pad body 40 is disposed directed to the inner peripheral side as illustrated in FIG. 2A. The wafer W transferred by the main arm A is stably held by abutment by the side surfaces on the inner peripheral side of the curved arm pieces 30a, 30b and the vacuum suction by the pad units H arranged at four places on the peripheral edge on the rear surface side of the wafer W.

On the other hand, when the pad units H are attached to the transfer arm body 32 constituting the delivery arm D illustrated in FIG. 2B, the pad units H can be attached at three places at the lower portions on the tip end portion side and the base end portion side of the curved arm piece 32a and on the base end portion side of the shortened arm piece 32b as with the main arm A.

The holding state of the wafer W by the man arm A configured as described above will be described.

Figure 9A:
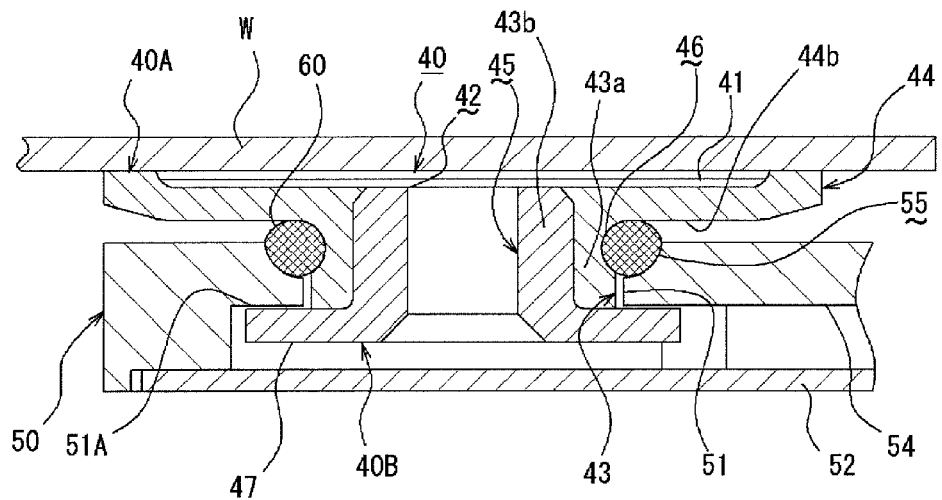
FIG. 9A is an enlarged sectional view of a principal part illustrating the state that the substrate holding device according to the first embodiment vacuum-sucks a substrate.

FIG. 9A is an enlarged sectional view of a principal part illustrating the state that the main arm A vacuum-sucks a wafer W without warpage or distortion (a flat wafer W). When the pad unit H vacuum-sucks the flat wafer W on the suction surface 41, the suction hole 45 and the communication path 54 in the pad unit H are brought into a negative pressure, which slightly lowers the pad body 40. In this case, the O-ring 60, even if elastically deformed by the lowering of the pad body 40, is in surface contact with the outer peripheral groove 46 in an arc shape formed in the pad body 40 and the inner peripheral groove 55 in an arc shape formed in the pad holding member 50 and maintains the airtightness.

Figure 9B:
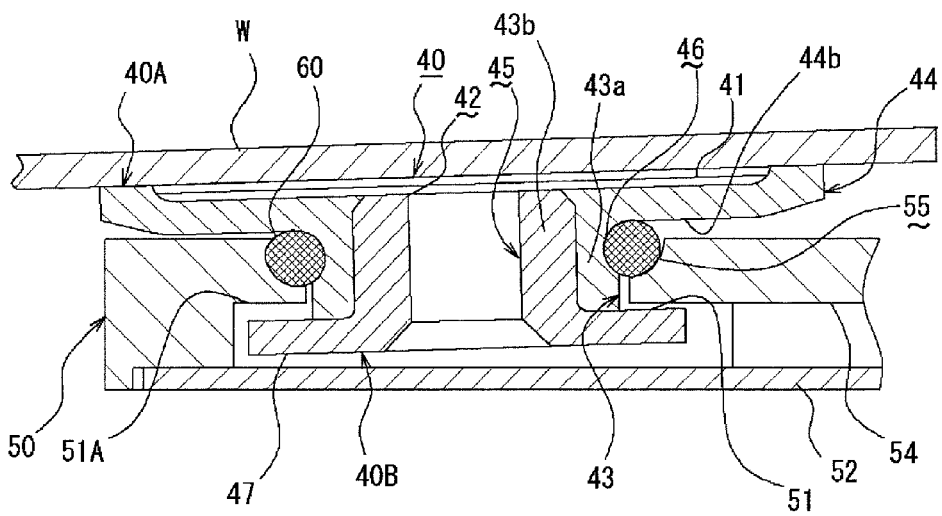
FIG. 9B is an enlarged sectional view of a principal part illustrating the state that the substrate holding device vacuum-sucks a curved substrate.

FIG. 9B is an enlarged sectional view illustrating the state that the main arm A vacuum-sucks a wafer W warped upward from the center portion toward the peripheral edge (a curved wafer W). When the curved wafer W is mounted, the pad unit H vacuum-sucks the wafer W by elastically deforming the O-ring 60 accompanying the warpage of the wafer W and bringing the suction hole 45 and the communication path 54 in the pad unit H into a negative pressure with the suction surface 41 inclined together with the pad body 40. The O-ring 60, even if elastically deformed by the inclination of the pad body 40, is in surface contact with the outer peripheral groove 46 in an arc shape formed in the pad body 40 and the inner peripheral groove 55 in an arc shape formed in the pad holding member 50 and can maintain the airtightness. Therefore, the main arm A can stably hold the wafer W by vacuum suction even when the pad body 40 inclines in any direction within 360 degrees.

As described above, with the main arm A according to the first embodiment, the O-ring 60 interposed between the outer peripheral groove 46 formed in the pad body 40 and the inner peripheral groove 55 formed in the pad holding member 50 elastically deforms, whereby the suction surface 41 formed at the suction part 44 of the pad body 40 is formed to protrude and retract with respect to the pad holding member 50 and formed to be able to incline in any direction within 360 degrees with respect to the pad holding member 50. Accordingly, even with a simple structure with a smaller number of parts, the main arm A can stably hold the wafer W by vacuum suction even if the wafer W has warpage or distortion.

Further, the radius of curvature r2 of the inner peripheral groove 55 and the radius of curvature r1 of the outer peripheral groove 46 are larger than the radius R of the circular cross-section of the O-ring 60. Accordingly, even when the O-ring 60 elastically deforms, the O-ring 60 can come into surface contact in a wide range with the outer peripheral groove 46 and the inner peripheral groove 55 each having the radius of curvature larger than the radius of the circular cross-section of the O-ring 60 to improve the airtightness, so that the main arm A can stably hold the wafer W by vacuum suction. Further, the O-ring 60 can come into surface contact with the outer peripheral groove 46 and the inner peripheral groove 55 while the compression force on the O-ring 60 generated by the protrusion and retraction of the pad body 40 from/to the pad holding member 50 and the inclination of the pad body 40 is dispersed, so that the durability of the O-ring 60 can be maintained.

Further, the suction part 44 is formed in a flange shape outward from the upper end of the attachment part 43, the outer peripheral groove 46 is formed starting from the attachment part 43 to the lower surface 44b of the suction part 44, the inner peripheral groove 55 is formed at the opening edge portion of the insertion hole 51, and the O-ring 60 has the upper portion projecting from the front surface of the pad holding member 50 and is interposed between the outer peripheral groove 46 and the inner peripheral groove 55, whereby the O-ring 60 can come into surface contact in a wide range with the outer peripheral groove 46 formed starting from the attachment part 43 to the lower surface 44b of the suction part 44 with the upper portion thereof projecting from the front surface of the pad holding member 50 to improve the airtightness, so that the wafer W can be stably held by vacuum suction.

Further, since the attachment part 43 is provided with the locking flange part 47 extending outward and the locking stepped part 51A to which the locking flange part 47 can be locked is formed on the outside of the lower end of the insertion hole 51, thereby making it possible to inhibit the pad body 40 from getting out of the pad holding member 50. Therefore, it is possible to prevent the pad body 40 from getting out of the pad holding member 50 when the vacuum suction is released and the wafer W is delivered.

Further, the pad holding member 50 is detachably fixed to the transfer arm body 30 via the sealing O-ring 65 and thereby can maintain the airtightness at the coupling portion between the pad holding member 50 and the transfer arm body 30, so that the wafer W can be stably held by vacuum suction. Further, since the pad holding member 50 can be easily attached and detached to/from the transfer arm body 30, only a failed pad unit H can be replaced with another, resulting in reduced cost.

The above-described main arm A according to the first embodiment holds and transfers the semiconductor wafer W being a substrate. The substrate holding device according to the present invention can be used, for example, as a delivery arm for transferring a glass substrate (substrate) used in manufacture of FPD (Flat Panel Display) or the like.

Figure 10:
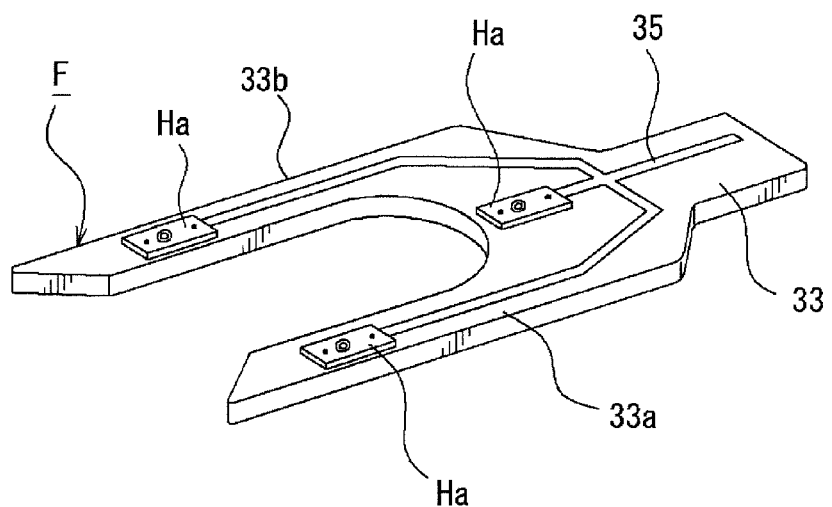
FIG. 10 is a perspective view illustrating a substrate holding device according to a fourth embodiment.
Figure 11:
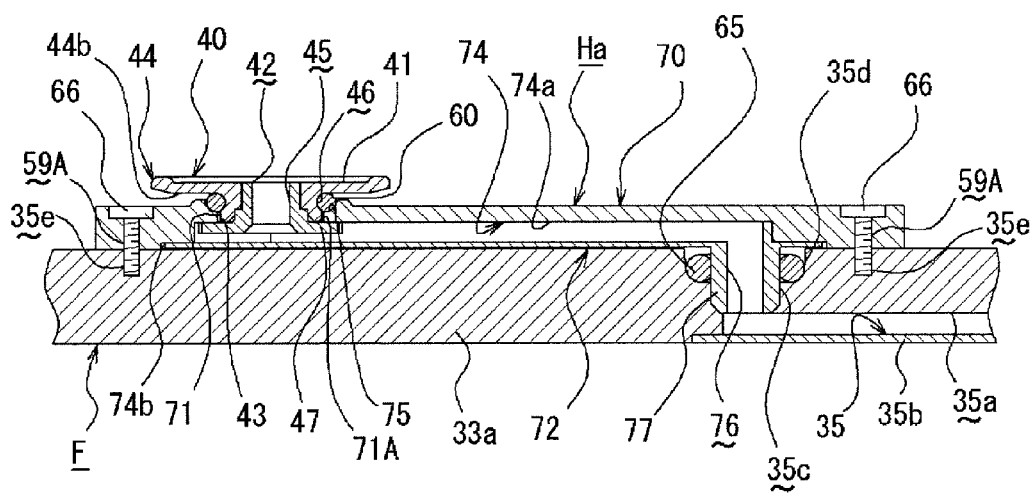
FIG. 11 is an enlarged sectional view of a principal part of the substrate holding device according to the fourth embodiment.

A substrate holding device (a delivery arm F) according to a fourth embodiment will be described. As illustrated in FIG. 10, FIG. 11, the delivery arm F is mainly composed of a transfer arm body 33 having a suction path 35, a pad body 40 configured similarly to that in the first embodiment, an insertion hole 71 into which an attachment par 43 of the pad body 40 can be loosely inserted, a pad holding member 70 formed with a communication path 74 communicating with the suction hole 45 and the suction path 35 and fixed to the transfer arm body 33, and an O-ring 60 interposed between an outer peripheral groove 46 in an arc shape formed in the attachment part 43 of the pad body 40 and an inner peripheral groove 75 in an arc shape formed at the insertion hole 71 of the pad holding member 70.

The transfer arm body 33 is formed in an almost fork shape by a pair of fork pieces 33a, 33b, and pad units Ha each composed of the pad body 40 and the pad holding member 70 are attached at three places on the front surface near the tip ends of the fork pieces 33a, 33b and the front surface of the base end portion.

Further, the suction path 35 is formed in the transfer arm body 33. The suction path 35 is composed of, as illustrated in FIG. 11, a groove part 35a communicating from the base end side to a connection hole 35c to which the pad unit Ha is coupled, on the rear surface side opposite to the front surface on which the wafer W is held of the transfer arm body 33, and a lid part 35b covering and hermetically sealing the groove part 35a from the rear surface side opposite to the front surface on which the wafer W is held. The connection hole 35c is formed starting from the rear surface side to the front surface side of the groove part 35a, and a peripheral groove 35d into which the sealing O-ring 65 is inserted is formed on the outside of the upper end of the connection hole 35c. Further, in the front surface of the transfer arm body 33, screw holes 35e for fixing the pad unit Ha with bolts 66 are formed at two places.

The pad holding member 70 includes, as illustrated in FIG. 11, the insertion hole 71 into which the attachment par 43 of the pad body 40 can be loosely inserted, a communication path 74 communicating with the suction hole 45 and the suction path 35, and the inner peripheral groove 75 in an arc shape formed at the insertion hole 71. Note that the inner peripheral groove 75 is formed at the opening edge portion of the insertion hole 71, and a locking stepped part 71A to which the locking flange part 47 of the pad body 40 can be locked is formed on the outside of the lower end of the insertion hole 71.

The communication path 74 is composed of a groove part 74a formed starting from the inside of one end portion to the inside of the other end portion on a surface (rear surface) side of the pad holding member 70 opposite to the front surface holding the wafer W thereon, and a lid part 72 for covering and hermetically sealing the groove part 74a. As illustrated in FIG. 11, the insertion hole 71 into which the attachment par 43 of the pad body 40 can be loosely inserted, in communication with the one end portion of the communication path 74, is formed toward the front surface. On the other hand, a communication hole 76 for communicating with the suction path 35, in communication with the other end portion of the communication path 74, is formed toward the rear surface. Around the groove part 74a, a lid receiving groove 74b to which the lid part 72 for hermetically sealing the groove part 74a from the rear surface side is provided.

The above-described communication hole 76 is formed penetrating a cylindrical projection part 77 formed in the lid part 72. A sealing O-ring 65 for maintaining the airtightness at a coupling portion with the transfer arm body 33 is attached on the base end side of the projection part 77.

Further, on both end portions of the pad holding member 70, a through hole 59A for fixing to the front surface of the transfer arm body 33 with a bolt 66 is formed at one place each.

Note that the other portions in the fourth embodiment are the same as those in the first embodiment, and therefore the same numerals and symbols are given to the same portions and the description thereof will be omitted.

For assembling the pad unit Ha with the transfer arm body 33 configured as described above, the projection part 77 is inserted into the connection hole 35c of the transfer arm body 33 from the front surface side by elastically deforming the sealing O-ring 65. Then, the bolts 66 are inserted from the front surface side into the through holes 59A formed on both ends of the pad holding member 70 and screwed to the screw holes 35e in the transfer arm body 33. In this manner, the pad holding member 70 is detachably fixed to the transfer arm body 33 via the sealing O-ring 65.

With the delivery arm F according to the fourth embodiment configured as described above, the same effects as those of the first embodiment can be achieved.

Note that though the above-described main arm A according to the first embodiment has the radius of curvature r1 of the outer peripheral groove 46 and the radius of curvature r2 of the inner peripheral groove 55 both of which are larger than the radius R of the circular cross-section of the O-ring 60, any one of the radius of curvature of the outer peripheral groove 46 and the radius of curvature of the inner peripheral groove 55 only needs to be a radius of curvature larger than the radius R of the circular cross-section of the O-ring 60.

For example, the radius of curvature of the inner peripheral groove 55 may be a radius of curvature larger than the radius R of the circular cross-section of the O-ring 60 and the radius of curvature of the outer peripheral groove 46 may be the same as the radius R of the circular cross-section of the O-ring 60. This configuration allows the O-ring 60, even if elastically deformed, to come into surface contact in a wide range with the inner peripheral groove 55 having a radius of curvature larger than the radius of the circular cross-section of the O-ring 60 to improve the airtightness, so that the wafer W can be stably held by vacuum suction. Further, the O-ring 60 can come into surface contact with the outer peripheral groove 46 and the inner peripheral groove 55 while the compression force on the O-ring 60 generated by the protrusion and retraction of the pad body 40 from/to the pad holding member 50 and the inclination of the pad body 40 is dispersed, so that the durability of the O-ring 60 can be maintained.

Though examples of embodiments of the present invention have been described, the present invention is not limited to the embodiments but can take various forms. For example, the substrate holding device according to the present invention in the case of horizontally holding the substrate by vacuum suction from below has been described, the orientation of the held substrate is not limited to horizontal direction. The substrate holding device according to the present invention can horizontally hold the substrate by vacuum suction from above, and can further hold the substrate by vacuum suction in the vertical direction or in an oblique direction.

What is claimed is:

1. A substrate holding device holding a substrate by suction, comprising:
   a transfer arm body having a suction path;
   a pad body including a suction part having a suction surface and a suction port for holding the substrate by vacuum suction, and a cylindrical attachment part in which a suction hole communicating with the suction port is formed;
   a pad holding member provided with an insertion hole into which the attachment part of said pad body is loosely insertable and a communication path communicating with the suction hole and the suction path, and fixed to said transfer arm body; and
   an elastically deformable annular airtightness maintaining member with a circular cross-section interposed between an outer peripheral groove in an arc shape formed in the attachment part of said pad body and an inner peripheral groove in an arc shape formed at the insertion hole of said pad holding member,
   wherein the suction part is formed in a flange shape outward from an upper end of the attachment part,
   wherein the outer peripheral groove is formed starting from the attachment part to a lower surface of the section part,
   wherein the inner peripheral groove is formed at opening edge portion of the insertion hole, and
   wherein said annular airtightness maintaining member has an upper portion projecting from a front surface of said pad holding member, and is interposed between the outer peripheral groove and the inner peripheral groove.

2. The substrate holding device as set forth in claim 1, wherein any one of a radius of curvature of the outer peripheral groove and a radius of curvature of the inner peripheral groove is a radius of curvature larger than a radius of the circular cross-section of said annular airtightness maintaining member.

3. The substrate holding device as set forth in claim 2, wherein the attachment part is provided with a locking flange part extending outward, and a locking stepped part to which the locking flange part is lockable is formed on an outside of a lower end of the insertion hole.

4. The substrate holding device as set forth in claim 3, wherein said pad holding member is detachably fixed to said transfer arm body via a sealing member.

5. The substrate holding device as set forth in claim 2, wherein said pad holding member is detachably fixed to said transfer arm body via a sealing member.

6. The substrate holding device as set forth in claim 1, wherein the attachment part is provided with a locking flange part extending outward, and a locking stepped part to which the locking flange part is lockable is formed on an outside of a lower end of the insertion hole.

7. The substrate holding device as set forth in claim 6, wherein said pad holding member is detachably fixed to said transfer arm body via a sealing member.

8. The substrate holding device as set forth in claim 1, wherein said pad holding member is detachably fixed to said transfer arm body via a sealing member.

* * * * *